United States Patent [19]

Garlick

[11] Patent Number: 4,710,254

[45] Date of Patent: Dec. 1, 1987

[54] PROCESS FOR FABRICATING A SOLAR ENERGY CONVERTER EMPLOYING A FLUORESCENT WAVELENGTH SHIFTER

[75] Inventor: George F. J. Garlick, Los Angeles, Calif.

[73] Assignee: Spectrolab, Inc., Sylmar, Calif.

[21] Appl. No.: 822,450

[22] Filed: Jan. 27, 1986

Related U.S. Application Data

[62] Division of Ser. No. 651,864, Sep. 12, 1984, Pat. No. 4,584,428.

[51] Int. Cl.$^4$ ............................................. B32B 31/12
[52] U.S. Cl. .................................... 156/278; 136/257; 136/262; 427/157; 428/409; 428/689
[58] Field of Search ................ 156/278; 136/257, 262; 427/157; 428/409, 689

[56] References Cited

U.S. PATENT DOCUMENTS 4,096,387  6/1978  Buckley .............................. 250/372
4,293,732  10/1981  Rancourt et al. .................... 136/257

Primary Examiner—Robert A. Dawson
Attorney, Agent, or Firm—Terje Gudmestad; A. W. Karambelas

[57] ABSTRACT

Disclosed herein is a solar converter structure and fabrication process therefor which includes a composite zinc selenide fluorescent wavelength shifter (FWS) prepared with anti-reflective (AR) coatings on both major surfaces thereof. One of these AR coatings is adhesively bonded to an AR coating on the sunlight-receiving surface of a gallium arsenide or an aluminum gallium arsenide photovoltaic (PV) solar cell, and the "freestanding" FWS composite wavelength shifter protects the solar cell from proton and ultraviolet radiation damage. The ZnSe wavelength shifter has a spectral response below about 0.47 micrometers and the solar cell has a spectral response above about 0.47 micrometers. The wavelength shifter absorbs radiation in the 0.3 to 0.47 micrometer range and re-emits radiation to the solar cell in a band centered about 0.62 micrometers and well within the pn junction response spectra for the solar cell to thereby enhance its power output.

7 Claims, 8 Drawing Figures

PROCESS FOR FABRICATING A SOLAR ENERGY CONVERTER EMPLOYING A FLUORESCENT WAVELENGTH SHIFTER

This is a divisional of application Ser. No. 651,864, filed Sept. 12, 1984 and now U.S. Pat. No. 4,584,428.

FIELD OF THE INVENTION

This invention relates generally to improving the efficiency of gallium arsenide and aluminum gallium arsenide solar cells. More particularly, the invention is directed to the inclusion of a self-standing fluorescent wavelength shifter (FWS) in a GaAs or AlGaAs solar converter. The FWS structure enhances collection efficiency of the converter and also provides protection for the GaAs or AlGaAs cell and its associated adhesive against radiation damage.

BACKGROUND

Various proposals have been made in the past to utilize a fluorescent material, such as zinc selenide (ZnSe), in combination with gallium arsenide or aluminum gallium arsenide solar cells to absorb the shorter wavelengths of solar flux (not able to directly excite a photovoltaic solar cell) and then re-emit the absorbed energy as longer wavelength fluorescence. This longer wavelength fluorescence may then be transmitted into the solar cell where it produces an output of electrical power additional to that produced by direct absorption of solar flux by the cell itself. Examples of such proposals are those made by H. J. Hovel et al, "The Effect of Fluorescent Wavelength Shifting on Solar Cell Spectral Response," *Solar Energy Materials* 2, (1979), pp. 19–29; and D. Walsh et al, "ZnSe Solar Spectrum Converter for GaAs Solar Cells," *IEEE*, 14th Photovoltaic Specialists Conference, (1980), pp. 476 and 477.

The problem with both of the above proposals is their failure to teach how to construct either a practical or a commerically feasable solution to the problem of physically combining and optically matching the fluorescent zinc selenide wavelength shifting material and the gallium arsenide or aluminum gallium arsenide solar cell. This construction must be done in such a manner as to protect the solar cell from ultraviolet radiation and proton damage while simultaneously enhancing its collection efficiency. The present invention provides a novel solution to the latter problem.

SUMMARY OF THE INVENTION

In accordance with the present invention, a fluorescent zinc selenide substrate is coated on its upper or sunlight-receiving surface with an anti-reflective (AR) coating or coatings and is also coated on its other or lower surface with another anti-reflective coating or coatings. This composite structure comprising a double side AR-coated zinc selenide fluorescent wavelength shifter is a "free-standing" structure or device. Preferably, the zinc selenide substrate is prepared by initially providing a commercially available, non-fluorescent zinc selenide substrate and then processing this substrate to convert it to a highly stable fluorescent material of good optical quality, transparency and fluorescence.

The above free-standing fluorescent wavelength shifter with anti-reflective coatings provides good optical matching between itself and an adjacent gallium arsenide or aluminum gallium arsenide solar cell to which it is adhesively bonded. This fluorescent wavelength shifter simultaneously protects the adhesive from ultraviolet radiation damage and also serves as a protective cover against proton radiation damage for the gallium arsenide or aluminum gallium arsenide solar cell in the usual manner of quartz cell cover. The self-standing fluorescent wavelength shifter is affixed to either a gallium arsenide or an aluminum gallium arsenide cell by a suitable transparent adhesive bonding material. The adhesive material must have good optical and bonding properties, and it firmly bonds the AR coated zinc selenide structure to an AR coating of the adjacent solar cell.

Thus, in accordance with the present invention, an advanced zinc selenide processing technology and anti-reflective coating forming technologies are used to form a free-standing FWS composite structure. These processes are carried out completely independently of the crystal growth (e.g., epitaxial growth) and other semiconductor processes associated with the fabrication of the gallium arsenide or aluminum gallium arsenide solar cells. In this manner, the advantages and sophistication of each of these different technologies are neither sacrificed nor compromised at the expense of the other, and this feature is manifest in the characterization of the fluorescent wavelength shifter composite structure as "free-standing."

In accordance with a preferred process and device embodying the invention, as will become more readily apparent below with reference to the drawings, the zinc selenide FWS substrate is prepared by initially providing a non-fluorescent zinc selenide material and then treating this material by a physico-chemical process, such as by the interaction of ZnSe with a chlorine-containing hydrogen selenide gas at a selected elevated temperature. This treatment results in a crystalline fluorescent zinc selenide substrate of unchanged mechanical stability and high optical quality. The mechanical and optical stabilities and the fluorescent efficiency of the zinc selenide substrate so prepared are not altered after undergoing subsequent anti-reflecting coating deposition and baking on both sides of the zinc selenide substrate.

The above advantages and features of this invention will become more readily apparent in the following description of the accompanying drawings.

BRIEF DESCRIPTION OF THE DRAWINGS

Referring now to FIG. 1, there is shown in schematic diagram a chemical process suitable for converting non-fluorescent zinc selenide substrates 10 to fluorescent zinc selenide. Initially the non-fluorescent zinc selenide substrates 10 are mounted as shown on a boat or carrier member 12 of a suitable non-reactive material such as quartz. The quartz carrier 12 is inserted in a quartz tube 14 which in turn is positioned along the central axis of a furnace 16. The inside of the quartz tube 14 is at approximately atmospheric pressure and is connected at its gas flow input end 18 to receive a combination of hydrogen selenide gas and a forming gas (NH$_3$) by way of the two joined gas flow lines 20 and 22, respectively.

Figure 1:
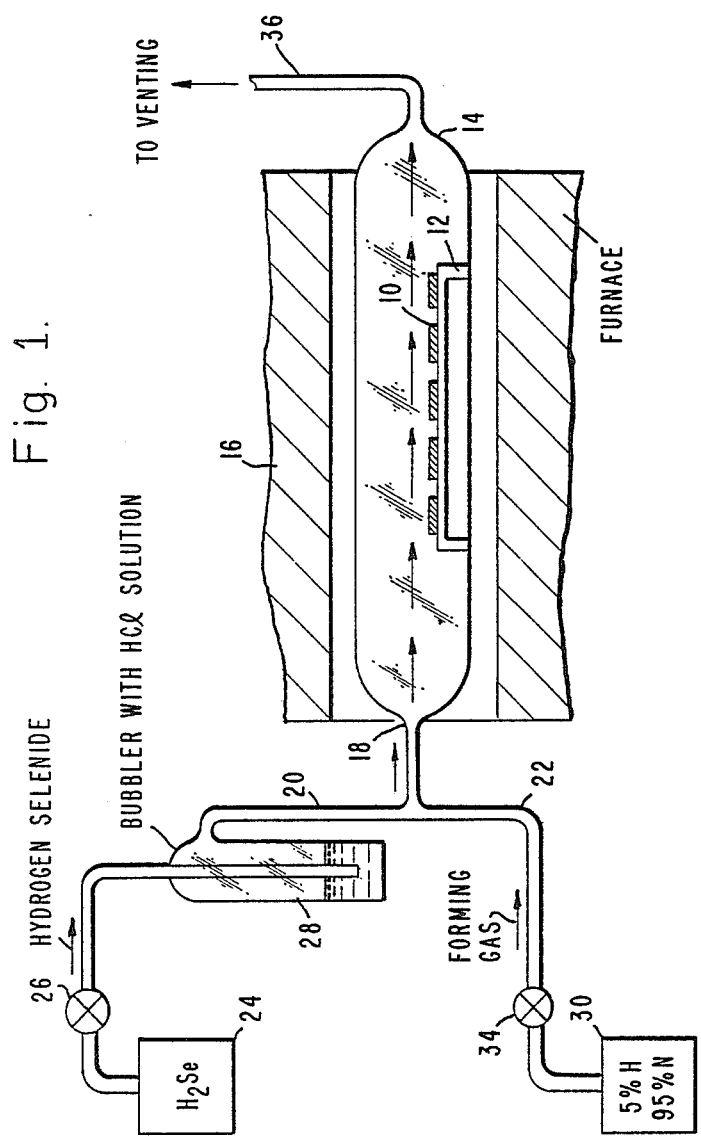
FIG. 1 is a schematic process flow diagram of a system used for processing zinc selenide to make it fluorescent.

A hydrogen selenide supply tank 24 is connected through a flow control valve 26 to a hydrogen chloride (HCl) bubbler 28 for the purpose of adding finite amounts of chlorine to the hydrogen selenide vapors before they enter the quartz tube 14. The forming gas supply tank 30 consisting essentially of 5% hydrogen and 95% nitrogen is connected through a gas flow control valve 34 and gas flow line 22 where it combines with the hydrogen selenide vapor as indicated at the common gas flow line 18. This vapor passes from left to right across the zinc selenide substrates 10 and exits the gas flow line 36 to a suitable ventilating system. The gas flow rate of vapors across the ZnSe substrates is typically up to about 300 cubic centimeters per minute.

The quartz tube 14 is heated typically to an elevated temperature between 800° and 900° C., preferably about 850° C., and at this elevated temperature, the chlorine-containing hydrogen selenide vapors react with the zinc selenide substrates 10 and thereby cause small finite amounts of chlorine to be added to the zinc selenide substrates while simultaneously drawing zinc out of these substrates and producing fluorescence therein. For a further discussion of combining chlorine atoms with zinc selenide in a gas flow system to produce fluorescence in zinc selenide, reference may be made to F. A. Kroger et al, "The Blue Luminescence of ZnS", *Transactions of the Electrochemical Society* 93, pages 156–171 (1948), and F. A. Kroger et al, "Chemical Determination of Chlorine in Blue Luminescence Zinc Sulfide, *Transactions of the Electrochemical Society* 95, pages 68–69 (1949). Although these latter references do not deal specifically with ZnSe, this compensatory effect of halogens in promoting zinc vacancies and the corresponding fluorescence is typical of the group of II-VI chemical compounds to which ZnSe belongs.

The above chemical process of FIG. 1 is continued for a period of approximately four to five hours whereafter the boat 12 and zinc selenide substrates 10 thereon are removed from the quartz tube in preparation for the physico-chemical process described below with reference to FIG. 2. The non-fluorescent ZnSe substrates 10 may be obtained from the Raytheon Corporation of Lexington, Massachusetts, and these untreated substrates contain relatively large crystals which are twinned to each other. After treatment, the fluorescent ZnSe substrates are a homogenous crystalline material which exhibit no loss in mechanical strength or optical quality.

Figure 2A:
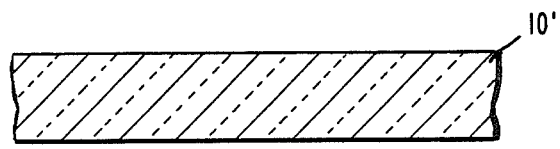
FIGS. 2a–2d are schematic illustrations of a preferred physico-chemical process sequence for fabricating the zinc selenide/aluminum gallium arsenide solar converter according to the invention.

In FIG. 2a, a fluorescent zinc selenide sheet or substrate 10' which has been treated in accordance with the foregoing procedure will typically be about 15 mils in thickness and of rectangular or square dimensions corresponding to the solar cell to be covered. These dimensions will typically be from two centimeters on a side to five centimeters on a side.

Figure 2B:
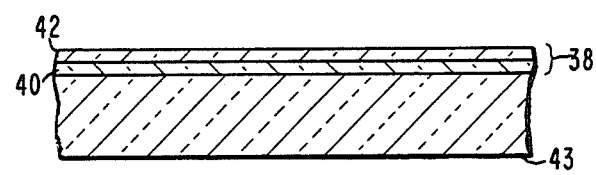

In FIG. 2b, an upper anti-reflective coating 38 is deposited on the upper surface of the zinc selenide substrate 10' and consists of a first layer of silicon oxide (SiO) with a refractive index of 1.9 and a typical thickness of 500 Å and a second layer of magnesium fluoride (MgF$_2$) with a refractive index of 1.38 and a typical thickness of 700 Å and suitably matched to the refractive index of air. The deposition of these anti-reflective coating layers is well known in the art and is described for example by L. Holland in a text entitled *Vacuum Deposition of Thin Films*, Chapman Hall, Ltd., London 1966 which is incorporated herein by reference. The purpose of the anti-reflective coating 38 is to minimize reflection of all wavelengths to which both the zinc selenide fluorescent wavelength shifter and the solar cell are responsive.

Figure 2C:
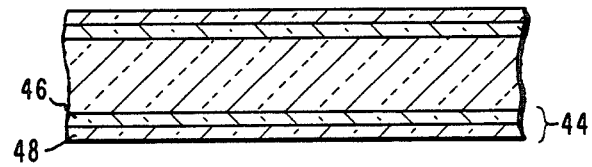

Prior to the deposition of the lower surface anti-reflective coating 44 as indicated in FIG. 2c, the lower surface 43 of the zinc selenide substrate 10' is roughened, serrated or textured in order to produce an easy egress of the radiation from that surface when the solar converter is in operation. After such treatment of the lower surface 43, the anti-reflective coating 44 is applied as shown in FIG. 2c and will preferably consist of a single layer of silicon oxide, SiO, having a refractive index of 1.9 and a typical thickness of 750 Å. Alternatively, the AR coating 44 in FIG. 2c may include a first layer 46 of titanium dioxide, TiO$_2$, having a refractive index of 2.4 followed by a layer 48 of aluminum oxide, Al$_2$O$_3$, having a refractive index of 1.63. Either of these layer configurations will suffice to form the lower anti-reflective coating 44.

Upon completing the depositions of the upper and lower surface AR-coatings 38 and 44 as indicated in FIG. 2c, the structure of FIG. 2c is transferred to an oven and heated to a preselected baking temperature between 300° and 350° C. for approximately one-half to one hour to bake these anti-reflective coatings and prepare the structure of FIG. 2c for the subsequent procedure of bonding to an aluminum gallium arsenide solar cell.

Figure 2D:
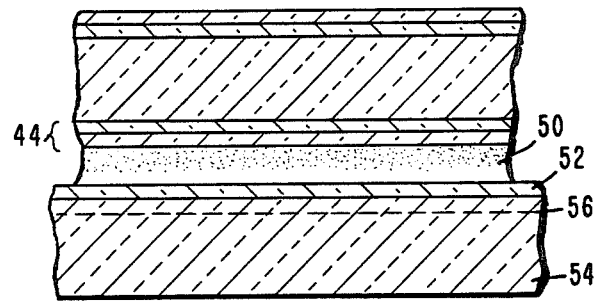

The latter step is accomplished as shown in FIG. 2d by the use of a suitable adhesive layer 50 such as dimethyl silicone to provide secure bonding and good optical matching between the lower anti-reflective coating 44 for the fluorescent wavelength shifter and an upper surface anti-reflective coating 52 for the aluminum gallium arsenide solar cell 54. As shown in FIG. 2d, solar cell 54 has a pn junction 56. A good adhesive material used to form the layer 50 may be obtained from the Dow-Corning Company of Midland, Mich. under the tradename "Adhesive 93500". Thus, the structure of FIG. 2d constitutes the complete novel composite solar converter according to the present invention and comprising a unique combination of a freestanding zinc selenide fluorescent wavelength shifter and either a gallium arsenide or an aluminum gallium arsenide solar cell with their facing AR coated surfaces bonded together by the intermediate adhesive layer 50.

The fabrication of GaAs and AlGaAs solar cells is generally well-known in the art and per se forms no part of the present invention. However, for a discussion of these and other similar solar cell devices, reference may be made to a book by H. J. Hovel entitled *Semiconductors and Semimetals*, Vol. II (Solar Cells) Academic Press, 1975, which is incorporated herein by reference.

As previously mentioned, the geometry of the zinc selenide substrate should be chosen to match the size of the gallium arsenide or aluminum gallium arsenide solar cell 54. Typically, a 2 cm×2 cm solar cell cell will require a 2 cm×2 cm sheet of zinc selenide (less the area required by the ohmic bar connect) and having a thickness sufficient to ensure the usually expected protection of the cell from proton radiation and also to conform to the weight requirement for solar converter systems to be used in space applications, The thickness of the zinc selenide substrate 10' needed for proton protection will be very much larger than that ever needed to protect the adhesive layer 50 from ultraviolet radiation damage, and so the latter is not considered in fixing the zinc selenide substrate thickness. A typical thickness for such a sheet 10' which serves as the protective cell cover in accordance with this invention will be on the order of 15 mils.

Figure 3A:
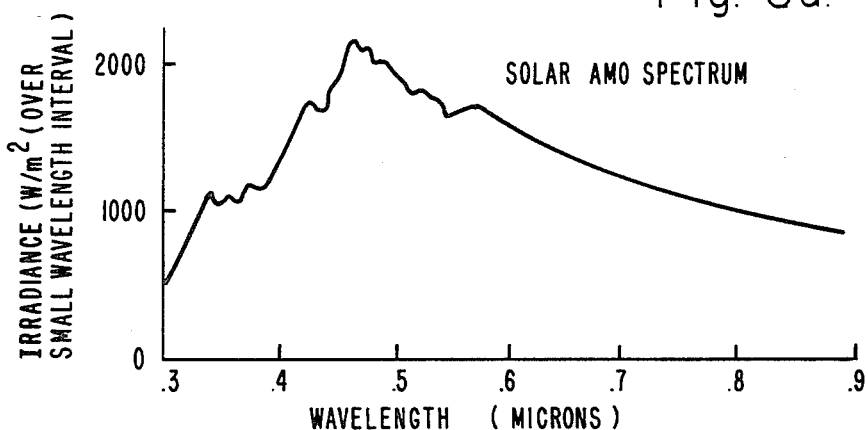
FIG. 3a is the spectrum of solar irradiance versus wavelength at air mass zero (AM0).
Figure 3B:
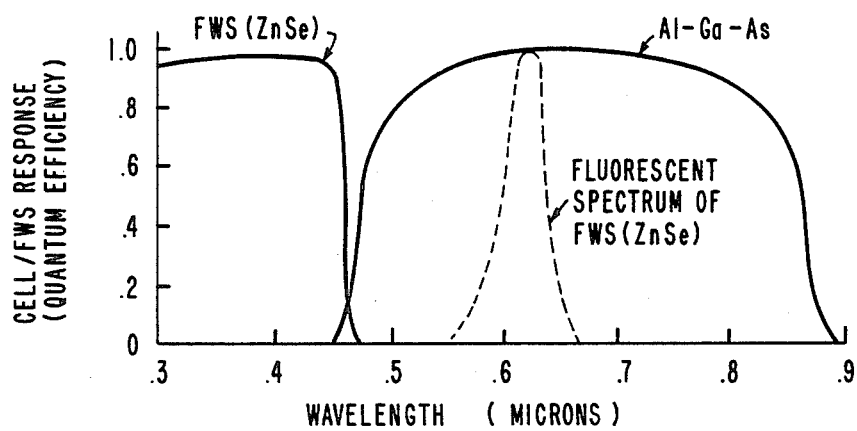
FIG. 3b shows the response spectra for the FWS and cell given as quantum efficiency versus wavelength.

Referring now to FIG. 3, there is shown in FIG. 3a the solar air mass (AMO) spectrum of the sun's irradiance in watts per square meter as a function of wavelength. The spectrum in FIG. 3a peaks at approximately 0.48 micrometers which, as indicated in FIG. 3b, is near the lower wavelength cutoff for the aluminum gallium arsenide solar cell. FIG. 3b shows the spectra for both the aluminum gallium arsenide solar cell and the zinc selenide fluorescent wavelength shifter as a plot of quantum efficiency versus wavelength, and the upper wavelength cutoff for the fluorescent wavelength shifter is at about 0.47 micrometers. The fluorescent wavelength shifter absorbs all solar radiation below about 0.47 micrometers and then re-emits longer wavelengths of radiation in a band centered at about 0.62 micrometers and well within the response spectra of the aluminum gallium arsenide solar cell. Thus, the re-emitted radiation of the fluorescent wavelength shifter provides added radiation input to the aluminum gallium arsenide solar cell to thus increase its power output.

Figure 3C:
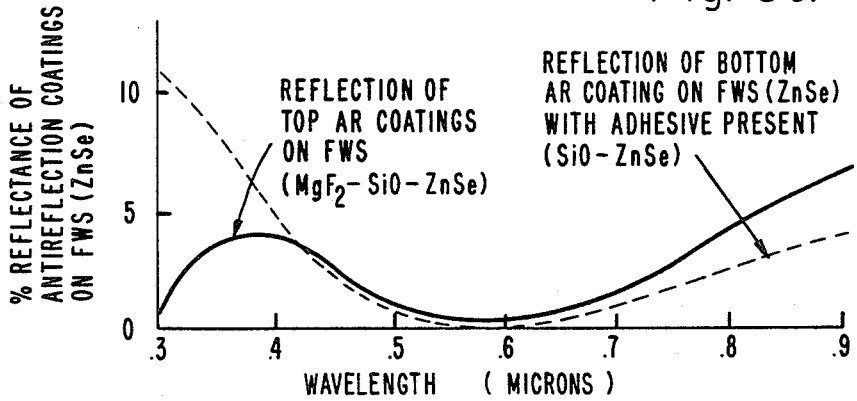
FIG. 3c shows the reflection spectra for the AR coatings which are part of the fluorescent wavelength shifter.

Referring now to FIG. 3c, there are shown variations of the percent reflectance of the upper and lower surface anti-reflection coatings on the fluorescent wavelength shifter as a function of wavelength.

As a result of the two spectra in FIG. 3b, the top anti-reflective coating 38 of the fluorescent wavelength shifter must have the quality of passing radiation from the wavelength region of approximately 0.3 micrometers in the ultraviolet up to the upper wavelength limit of the aluminum gallium arsenide cell response, which is about 0.9 micrometers. This top coating 38 can achieve this by employing a first layer of silicon oxide or similar refractive index material on top of which is deposited a second layer or coating of magnesium fluoride which serves to give the necessary step down to match with the refractive index of air or space outside.

As a result of final baking of the anti-reflective coatings and using a suitable deposition thickness, it is possible to achieve the spectra for reflection shown in FIG. 3c. These reflection spectra provide an optimum transmission of radiation to the two primary components of the converter, namely the fluorescent wavelength shifter and the gallium arsenide or aluminum gallium arsenide cell. The fluorescent wavelength shifter is optically matched to the adhesive layer 50, and the adhesive layer 50 is in turn optically matched to the gallium arsenide or aluminum gallium arsenide cell and its anti-reflection coating or coatings 52. Therefore, the total optical system described above ensures maximum usage of the short wavelength radiation by the fluorescent wavelength shifter and maximum transmission of the longer wavelength solar radiation to activate the solar cell and also to pass the longer wavelength fluorescence in the red region around 0.63 micrometers and emitted by the zinc selenide as a result of its own absorption of the solar flux. This operation maximizes the efficiency of use of all of the incoming solar radiation.

The above-described converter has a high stability in the presence of space radiation and is highly resistant, for example, to 10 MEV protons and to short wavelength ultraviolet light. There is no change in this radiation resistance even at radiation doses of 1 MEV electrons at $10^{16}$ electrons per sq. centimeter.

Thus, there has been described a novel solar converter and process for fabricating same wherein independent and advanced technologies are used respectively for fabricating the aluminum gallium arsenide or gallium arsenide solar cell on the one hand and the zinc selenide fluorescent wavelength shifter on the other hand. These members are then bonded together with a high quality adhesive transparent bonding material with good optical matching qualities for the adjacent anti-reflective coatings for maximizing the radiation conversion efficiency of the solar converter.

What is claimed is:

1. A process for fabricating a solar converter which includes a gallium arsenide photovoltaic solar cell in combination with a zinc selenide fluorescent wavelength shifter comprising:
    (a) providing a fluorescent zinc selenide substrate by passing chlorine-contaning zinc selenide vapor over a nonfluorescent zinc selenide substrate at a predetermined elevated temperature to introduce chlorine atoms into said substrate for a time sufficient to convert nonfluorescent zinc selenide to high quality, stable fluorescent zinc selenide;
    (b) coating one surface of said zinc selenide substrate with a first anti-reflective coating;
    (c) coating another surface of said zinc selenide substrate with a second anti-reflective coating;
    (d) providing a gallium arsenide solar cell having an anti-reflecting coating thereon; and
    (e) adhesively bonding said second anti-reflective coating on said zinc selenide substrate to said antireflecting coating on said solar cell using a transparent bonding material, whereby said solar cell is protected from ultraviolet and proton radiation damage.

2. A process for converting non-fluorescent ZnSe substrates to fluorescent ZnSe which comprises:
    (a) exposing said ZnSe substrates to vapors of chlorine-containing hydrogen selenide for a predetermined time while simultaneously
    (b) heating said ZnSe substrates at a predetermined elevated temperature whereby chlorine atoms replace zinc atoms in said substrates to produce fluorescence therein.

3. A process for fabricating a fluorescent wavelength shifter for a solar converter which comprises:
    (a) providing a nonfluorescent zinc selenide substrate;
    (b) introducing chlorine atoms into said substrate to make it fluorescent by passing hydrogen selenide vapor containing chlorine over said zinc selenide substrate at a predetermined elevated temperature and for a predetermined time;
    (c) depositing anti-reflective coatings on both sides of said substrate; and
    (d) baking said substrate and anti-reflective coatings thereon at a predetermined elevated temperature and time sufficient to achieve reflective spectra for said coatings compatible with the response spectra for a GaAs or a AlGaAs solar cell.

4. The process according to claim 3 wherein the deposition of one of said anti-reflective coatings includes depositing a first layer of silicon oxide, SiO, followed by the subsequent deposition of a layer of magnesium fluoride, $MgF_2$, on said SiO layer; and the deposition of the other anti-reflective coating includes depositing either a single layer of silicon oxide, SiO, or depositing a first layer of titanium dioxide, $TiO_2$, followed by the subsequent deposition of a layer of aluminum oxide, $Al_2O_3$.

5. A fluorescent wavelength shifter for use with GaAs or AlGaAs solar cells comprising:
   (a) a fluorescent zinc selenide substrate having one surface thereof roughened, serrated or textured to permit the easy egrees of light from said substrate; and
   (b) anti-reflective coatings baked on both surfaces of said substrate and having reflection spectra compatible with the pn junction response of AlGaAs and GaAs solar cells.

6. The wavelength shifter according to claim 5 wherein the deposition of one of said anti-reflective coatings includes depositing a first layer of silicon oxide, SiO, followed by the subsequent deposition of a layer of magnesium fluoride, $MgF_2$, on said SiO layer; and the deposition of the other anti-reflective coating includes depositing either a single layer of silicon oxide, SiO, or depositing a first layer of titanium dioxide, $TiO_2$, followed by the subsequent deposition of a layer of aluminum oxide, $Al_2O_3$.

7. A process for fabricating a solar converter which includes an aluminum gallium arsenide photovoltaic solar cell in combination with a zinc selenide fluorescent wavelength shifter comprising:
   (a) providing a fluorescent zinc selenide substrate by passing chlorine-containing zinc selenide vapor over a nonfluorescent zinc selenide substrate at a predetermined elevated temperature to introduce chlorine atoms into said substrate for a time sufficient to convert nonfluorescent zinc selenide to high quality, stable fluorescent zinc selenide;
   (b) coating one surface of said zinc selenide substrate with a first anti-reflective coating;
   (c) coating another surface of said zinc selenide substrate with a second anti-reflective coating;
   (d) providing an aluminum gallium arsenide solar cell having an anti-reflecting coating thereon; and
   (e) adhesively bonding said second anti-reflective coating on said zinc selenide substrate to said anti-reflecting coating on said solar cell using a transparent bonding material, whereby said solar cell is protected from ultraviolet and proton radiation damage.

* * * * *